(12) United States Patent
Kuroda et al.

(10) Patent No.: US 11,570,901 B2
(45) Date of Patent: Jan. 31, 2023

(54) METHOD FOR MANUFACTURING ALUMINUM CIRCUIT BOARD

(71) Applicants: NATIONAL INSTITUTE FOR MATERIALS SCIENCE, Tsukuba (JP); DENKA COMPANY LIMITED, Tokyo (JP)

(72) Inventors: Seiji Kuroda, Tsukuba (JP); Hiroshi Araki, Tsukuba (JP); Akira Hasegawa, Tsukuba (JP); Makoto Watanabe, Tsukuba (JP); Atsushi Sakai, Omuta (JP); Yoshitaka Taniguchi, Omuta (JP); Suzuya Yamada, Tokyo (JP)

(73) Assignees: NATIONAL INSTITUTE FOR MATERIALS SCIENCE, Tsukuba (JP); DENKA COMPANY LIMITED, Tokyo (JP)

( * ) Notice: Subject to any disclaimer, the term of this patent is extended or adjusted under 35 U.S.C. 154(b) by 127 days.

(21) Appl. No.: 16/488,776

(22) PCT Filed: Feb. 22, 2018

(86) PCT No.: PCT/JP2018/006488
§ 371 (c)(1),
(2) Date: Aug. 26, 2019

(87) PCT Pub. No.: WO2018/155564
PCT Pub. Date: Aug. 30, 2018

(65) Prior Publication Data
US 2020/0120809 A1    Apr. 16, 2020

(30) Foreign Application Priority Data
Feb. 24, 2017 (JP) .............................. JP2017-033784

(51) Int. Cl.
H05K 3/14      (2006.01)
C22C 21/06     (2006.01)
H05K 1/03      (2006.01)

(52) U.S. Cl.
CPC ............... *H05K 3/14* (2013.01); *C22C 21/06* (2013.01); *H05K 1/0306* (2013.01); *H05K 2203/1344* (2013.01)

(58) Field of Classification Search
CPC ........ C22C 21/06; H05K 1/0306; H05K 3/14; H05K 2203/1344
See application file for complete search history.

(56) References Cited

U.S. PATENT DOCUMENTS 5,302,414 A * 4/1994 Alkhimov ............. B05B 7/1486
                                                      427/195
7,256,431 B2* 8/2007 Okamoto .............. C23C 28/345
                                                      257/177

(Continued)

FOREIGN PATENT DOCUMENTS

CN    1651605 A      8/2005
CN    102593074 A    7/2012
(Continued)

OTHER PUBLICATIONS

Supersonic flame spraying technology and application / Cha Bolin, Wang Hangong, Yuan Xiaojing. 1. Beijing: National Defense Industry Press, 2013. 7 ISBN 978-7-118-08718-5 (Year: 2013).*

(Continued)

Primary Examiner — Carl J Arbes
(74) Attorney, Agent, or Firm — Oliff PLC (57) ABSTRACT

A method for manufacturing an aluminum circuit board including a step of spraying a heated metal powder containing aluminum particles and/or aluminum alloy particles to a ceramic base material, and of forming a metal layer on a surface of the ceramic base material. A temperature of at (Continued)

least a part of the metal powder is higher than or equal to a softening temperature of the metal powder and lower than or equal to a melting point of the metal powder at a time point of reaching the surface of the ceramic base material. A velocity of at least a part of the metal powder is greater than or equal to 450 m/s and less than or equal to 1000 m/s at the time point of reaching the surface of the ceramic base material.

13 Claims, 6 Drawing Sheets

(56) References Cited

U.S. PATENT DOCUMENTS

| | | | |
|---|---|---|---|
| 9,219,218 B2* | 12/2015 | Ishigami | B22F 1/02 |
| 2003/0175559 A1* | 9/2003 | Morelli | C23C 24/04 |
| | | | 428/702 |
| 2006/0063024 A1* | 3/2006 | Natsuhara | C23C 4/12 |
| | | | 428/621 |

FOREIGN PATENT DOCUMENTS

| | | | | |
|---|---|---|---|---|
| EP | 0 484 533 B1 | * | 5/1992 | |
| EP | 2 732 967 A1 | | 5/2014 | |
| JP | H07-193358 A | | 7/1995 | |
| JP | 2001-085808 A | | 3/2001 | |
| JP | 2003-089883 A | | 3/2003 | |
| JP | 2009-206443 A | | 9/2009 | |
| JP | 2009206443 A | * | 9/2009 | |
| JP | 2012-153581 A | | 8/2012 | |
| JP | 2012153581 A | * | 8/2012 | |
| JP | 5098109 B2 | | 12/2012 | |
| JP | 2013-067825 A | * | 4/2013 | |
| JP | 2013-067825 A | * | 8/2013 | |
| JP | 2016-152324 A | * | 8/2016 | |
| WO | 2013/047330 A1 | | 4/2013 | |
| WO | 2015/064430 A1 | | 5/2015 | |

OTHER PUBLICATIONS

Aug. 26, 2020 Office Action issued in European Patent Application No. 18758454.5.
T. Stoltenhoff et al.; "An Analysis of the Cold Spray Process and Its Coatings;" Journal of Thermal Spray Technology; Dec. 1, 2002; vol. 11 No. 4; pp. 542-550.
P. Berman et al. "The Size Dependence of the Melting Point of Small Particles of Indium;" Canadian Journal of Physics; Sep. 5, 2011; pp. 923-929.
Bolin et al; "High Velocity Oxygen-fuel Technology and Applications;" National Defense Industry Press; Jul. 31, 2013.
Dec. 19, 2019 Search Report issued in European Patent Application No. 18758454.5.
Aug. 27, 2019 International Preliminary Report on Patentability issued in International Patent Application No. PCT/JP2018/006488.
Choi et al; "Integrated characterization of cold sprayed aluminum coatings"; Acta Materialia; 2007; pp. 857-866; vol. 55, No. 3.
Jun. 9, 2021 Office Action issued in Chinese Application No. 201880013217.2.
Aug. 17, 2021 Office Action issued in Japanese Patent Application No. 2019-501418.

* cited by examiner

METHOD FOR MANUFACTURING ALUMINUM CIRCUIT BOARD

TECHNICAL FIELD

The present invention relates to a method for manufacturing an aluminum circuit board. Further, the present invention relates to an aluminum circuit board and an electronic device using the method for manufacturing the aluminum circuit board.

BACKGROUND ART

An aluminum circuit board including a ceramic base material such as alumina, and a circuit layer formed on both surfaces of the ceramic base material has been practically realized as a semiconductor device that is used in a power module or the like.

Recently, there is a tendency that a heat release value of the semiconductor device increases in accordance with smaller size and higher performance of devices. For this reason, the ceramic base material for a ceramic circuit board has been required to higher heat conductivity, in addition to high electrical insulating properties.

Therefore, the application of the ceramic base material having high heat conductivity, such as aluminum nitride, has been considered. However, in a case where a copper circuit is provided on the ceramic base material having high heat conductivity, there is a problem that a crack tends to be easily generated in the vicinity of a joining portion between the ceramic base material and the copper circuit, due to repeated heat cycles or a temperature change in the service environment during the operation of such semiconductor element.

In order to avoid such a problem, it has been considered to use aluminum having lower yield strength than that of copper as a circuit material. For example, the following methods have been proposed as a method for forming an aluminum circuit on the ceramic base material.

(1) A molten metal method including forming a joined body of molten aluminum and a ceramic base material by bringing the molten aluminum and the ceramic base material into contact with each other, and by cooling the molten aluminum and the ceramic base material, and by adjusting the thickness of the formed aluminum layer by mechanical grinding, and finally by etching the aluminum layer (for example, refer to Patent Literature 1)

(2) A brazing method of brazing an aluminum foil or an aluminum alloy foil on a ceramic base material, and then performing etching (for example, refer to Patent Literature 2)

(3) A method of providing an aluminum-based brazing material on a ceramic base material, and forming an aluminum circuit layer thereon by the so-called cold spraying method (for example, refer to Patent Literature 3)

CITATION LIST

Patent Literature

Patent Literature 1: Japanese Unexamined Patent Publication No. H7-193358
Patent Literature 2: Japanese Unexamined Patent Publication No. 2001-085808
Patent Literature 3: International Publication No. 2013/047330

Patent Literature 4: Japanese Patent No. 5098109

Non Patent Literature

Non Patent Literature 1: Integrated characterization of cold sprayed aluminum coatings, W. B. Choi, L. Li, V. Luzin, R. Neiser, T. Gnaupel-Herold, H. J. Prask, S. Sampath, A. Gouldstone, Acta Materialia, Volume 55, Issue 3, February 2007, Page 857-866

SUMMARY OF INVENTION

Technical Problem

However, in the molten metal method, there is a problem that the facility cost and the facility maintenance cost are expensive.

In the brazing method, it is necessary to join the ceramic board material with the aluminum foil or the aluminum alloy foil at a high temperature by applying a pressure over all the area all the time. The pressurization is performed by mechanical means such as by placing the laminated body in a graphite jig, and pushing from both end surfaces by screwing. In such a method, there is a problem that productivity is not sufficiently high.

Further, in both of the molten metal method and the brazing method, an etching step is necessary for forming a circuit, and thus, there is a problem of manufacturing steps becoming longer.

It has been considered that an aluminum film is formed on a ceramic board by the cold spraying method. It is generally accepted that a dense aluminum film can be obtained by this process. In cold spraying, metal powder in a solid state collides with the base material. When the collision velocity is greater than a certain value, deformation near the interface between the powder and the base material progresses faster than the dissipation of heat generated by the high-speed plastic deformation to the surroundings through thermal conduction, and thus, temperature rapidly increases in the vicinity of the interface, and the region of the metal powder is brought into a molten state. As a result thereof, a theoretical explanation of how joining occurs is that a thin liquid film is discharged from the interface, and newly formed fresh surfaces are exposed and are joined together. However, there are problems that inert gas is heated by an electric heater, whose power consumption is large, and expensive gas such as helium is necessary in order to highly accelerate the powder.

An aluminum layer can also be formed by conventional thermal spraying methods in which powder is melted and is sprayed to a base material. However, there is a problem that aluminum has high reactivity with oxygen and nitrogen at a high temperature above the melting point, and thus, in a conventional thermal spraying device where thermal spraying is performed in the atmosphere, a film having a low density and rich in oxide and nitride is formed. Recently, warm spraying has been also considered as one of new methods of forming metal layers. The warm spraying method is a technology in which film formation is performed by spraying metal powder to a base material at a high velocity, along with carrier gas that is heated within the temperature range to soften the metal powder (for example, refer to Patent Literature 4).

The present invention has been made in consideration of the circumstances described above, and a main object thereof is to provide a method in which it is possible to easily manufacture an aluminum circuit board including a metal layer that contains aluminum and/or an aluminum alloy, and is foil led on a ceramic base material with high adhesiveness.

Solution to Problem

One aspect of the present invention provides a method for manufacturing an aluminum circuit board, including: a step of spraying heated metal powder containing aluminum particles and/or aluminum alloy particles to a ceramic base material, and thereby forming a metal layer on a surface of the ceramic base material. The temperature of at least a part of the metal powder is higher than or equal to the softening temperature of the metal powder and lower than or equal to the melting point of the metal powder at a time point of reaching the surface of the ceramic base material. The softening temperature is a temperature that is defined as a value of melting point×0.6 in the absolute temperature scale. The velocity of at least a part of the metal powder is greater than or equal to 450 m/s and less than or equal to 1000 m/s at the time point of reaching the surface of the ceramic base material.

According to such a method, a metal layer that contains aluminum and/or an aluminum alloy and has high adhesiveness can be easily formed on the surface of a ceramic base material. In a case where the velocity of the metal powder is less than 450 m/s, there is a tendency that the formed metal layer on the surface of the ceramic base material tends to easily peel off, or its adhesion to the base plate tends to be insufficient. In a case where the velocity of the metal powder is greater than 1000 m/s, there is a tendency that the metal layer that is already attached onto the surface of the ceramic base material tends to be removed by erosion. From the same viewpoint, the velocity of the metal powder at the time point of reaching the surface of the ceramic base material may be greater than or equal to 750 m/s and less than or equal to 900 m/s. In a case where the temperature of the metal powder is lower than the softening temperature, the deformation of the metal powder is suppressed, and there is a tendency that the adhesiveness of the metal powder to the ceramic base material and the density of the metal layer decrease. In a case where the temperature of the metal powder is higher than the melting point, there is a tendency that the metal powder is oxidized, and in particular, when the velocity of the metal powder is high, there is a tendency that the metal powder that collides with the ceramic base material is disintegrated and blown away, and thus, it is difficult to form a metal layer.

In the particle diameter distribution of the metal powder, a particle diameter $D_{10}$, which is the diameter at which 10% of the sample's mass is comprised of particles with a diameter less than this value may be greater than or equal to 10 μm, and the particle diameter $D_{90}$ of a cumulative mass percentage of 90% $D_{90}$, which is the diameter at which 90% of the sample's mass is comprised of particles with a diameter less than this value, may be less than or equal to 50 μm. As described below, in the warm spraying method, there is a tendency that metal particles having a particle diameter of less than 10 μm tend to collide with the surface of the ceramic base material in a completely molten state. There is a tendency that the metal particles having a particle diameter of greater than 50 μm tend to be heated to temperature lower than the softening temperature at the time point of reaching the surface of the ceramic base material. Therefore, when the ratio of particles having diameter within a range of 10 μm to 50 μm increases, there is a tendency that the metal powder is prevented from being scattered and oxidized, and a dense metal layer having high adhesiveness is more easily formed.

From the same viewpoint, $D_{10}$ of the metal powder may be greater than or equal to 20 μm, and $D_{90}$ of the metal powder may be less than or equal to 45 μm.

The aluminum particles and the aluminum alloy particles are respectively metal particles containing aluminum and an aluminum alloy as their main component. In the present specification, the main component indicates a component that is contained at a ratio of greater than or equal to 90 mass % with respect to the whole. A ratio of the main component may be greater than or equal to 95 mass %. The aluminum alloy particles may be particles formed of aluminum as the main component, with magnesium, and residual inevitable impurities. The content of magnesium may be less than or equal to 7.5 mass % on the basis of the mass of the aluminum alloy particles.

It is preferred that the metal powder be heated such that the temperature of most (for example, greater than or equal to 80 mass % of the total amount) of the metal powder sprayed onto the ceramic base material is higher than or equal to the softening temperature of the metal powder and lower than or equal to the melting point of the metal powder at the time point of reaching the surface of the ceramic base material. For example, the ratio of metal powder of which the temperature at the time point of reaching the surface of the ceramic base material is lower than the softening temperature of the metal powder may be less than or equal to 10 mass %, the ratio of metal powder of which the temperature at the time point of reaching the surface of the ceramic base material is higher than the melting point of the metal powder may be less than or equal to 10 mass %, and the temperature of the rest of the metal powder at the time point of reaching the surface of the ceramic base material may be higher than or equal to the softening temperature of the metal powder and lower than or equal to the melting point of the metal powder.

The metal powder may contain aluminum alloy particles. The method for manufacturing the aluminum circuit board may further include: a step of spraying a first metal layer formed on the surface of the ceramic base material, and thereby forming a second metal layer on the surface of the first metal layer. The thickness of the first metal layer may be less than or equal to 150 μm. Since aluminum alloy (in particular, an aluminum-magnesium alloy) has high adhesiveness with respect to the ceramic base material as compared to aluminum, it is preferred that the first metal layer directly provided on the surface of the ceramic base material contain aluminum alloy as the main component.

Another aspect of the present invention provides an aluminum circuit board, including: a ceramic base material; and a metal layer formed by performing film formation of metal powder containing aluminum particles and/or aluminum alloy particles on a surface of the ceramic base material by the warm spraying method. In the aluminum circuit board, the electric resistivity of the metal layer is less than or equal to $5 \times 10^{-8}$ Ωm. The electric resistivity of the metal layer may be less than or equal to $4 \times 10^{-8}$ Ωm. A lower limit of the electric resistivity of the metal layer is not particularly specified, but in general, is greater than $2.65 \times 10^{-8}$ Ωm.

Still another aspect of the present invention provides an electronic device, including the aluminum circuit board described above.

ADVANTAGEOUS EFFECTS OF INVENTION

The method for manufacturing an aluminum circuit board of the present invention has advantages that aluminum and ceramic are joined together without using molten aluminum or a brazing material, and by using a mask, it is possible to manufacture an aluminum circuit board without etching. In comparison to the cold spraying method as a method for manufacturing an aluminum circuit board, the present invention is capable of manufacturing a metal layer having higher adhesiveness and smaller electric resistance with superior efficiency for mass production.

DESCRIPTION OF EMBODIMENTS

Hereinafter, some embodiments of the present invention will be described in detail. However, the present invention is not limited to the following embodiments.

Technical terms used in the present specification will be defined.

A "powder" used in the present specification indicates an aggregate having fluidity that is configured of a plurality of particles having different particle diameters. In the measurement of a "particle diameter distribution of the powder", a laser diffraction and scattering method is widely used, and the methods of measurement and description of the results thereof are based on JIS Z 8825 "Particle Diameter Analysis-Laser Diffraction and Scattering Method".

In the mass-based particle diameter distribution of the powder, particle diameter $D_{10}$ indicates the diameter at which 10% of the sample's mass is comprised of particles with a diameter less than this value. Similarly, particle diameter $D_{90}$ indicates the diameter at which 90% of the sample's mass is comprised of particles with a diameter less than this value. In particular, $D_{50}$ as defined as above is referred to as the median diameter.

Figure 1:
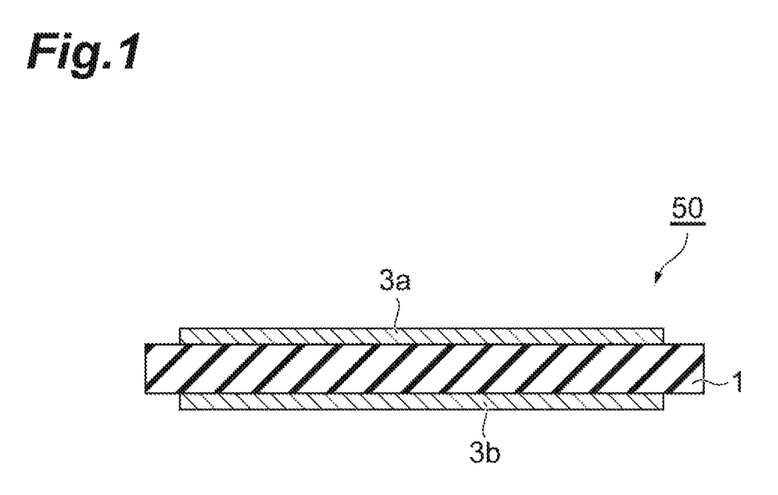
FIG. 1 is a sectional view illustrating an embodiment of an aluminum circuit board.

FIG. 1 is a sectional view illustrating an embodiment of an aluminum circuit board. An aluminum circuit board 50 illustrated in FIG. 1 includes a ceramic base material 1, and metal layers 3a and 3b that are respectively provided with being in contact with both surfaces of the ceramic base material 1. Each of the metal layers 3a and 3b is a layer that is formed by spraying heated metal powder, and usually has a circuit pattern that is connected to a semiconductor element. The details of a method for forming the metal layers 3a and 3b will be described below.

Figure 2:
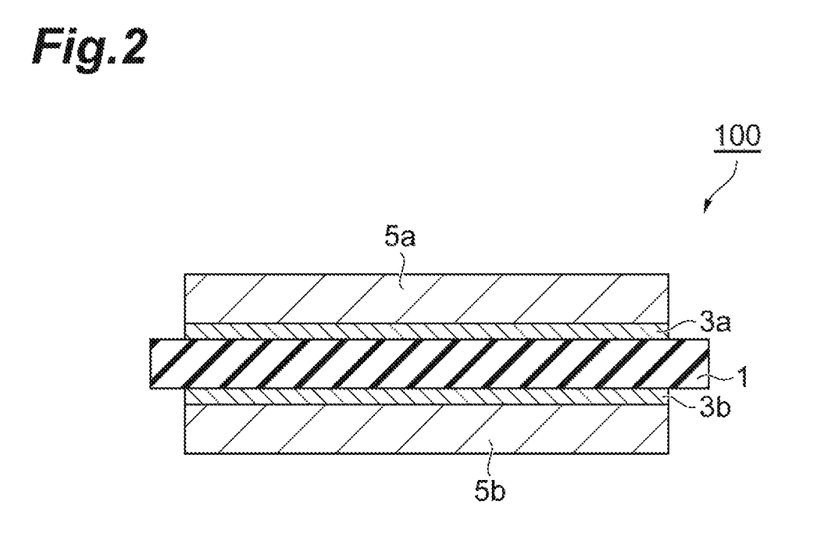
FIG. 2 is a sectional view illustrating another embodiment of an aluminum circuit board.

FIG. 2 is also a sectional view illustrating another embodiment of an aluminum circuit board. The aluminum circuit board 100 illustrated in FIG. 2 further includes second metal layers 5a and 5b in addition to the same configuration as that of the aluminum circuit board 50, that are provided on the surfaces of the metal layers 3a and 3b attached to the ceramic base material and used as the first metal layers respectively. The second metal layers 5a and 5b can configure a circuit layer.

The thickness of the metal layers 3a and 3b is not particularly limited, and for example, may be from 200 µm to 600 µm. Similarly, the total thickness of the metal layers 3a and 3b as the first metal layer, and the second metal layers 5a and 5b, for example, may be from 200 µm to 600 µm. The thickness of the metal layers 3a and 3b as the first metal layer may be less than or equal to 150 µm.

The ceramic base material 1 can be selected from ceramic materials having suitable insulating properties. The ceramic base material 1 should also has high thermal conductivity, and examples thereof include aluminum nitride (AlN), silicon nitride ($Si_3N_4$), and aluminum oxide ($Al_2O_3$). The thickness of the ceramic base material 1 is not particularly limited, and for example, may be from 0.2 mm to 1.0 mm.

Figure 3:
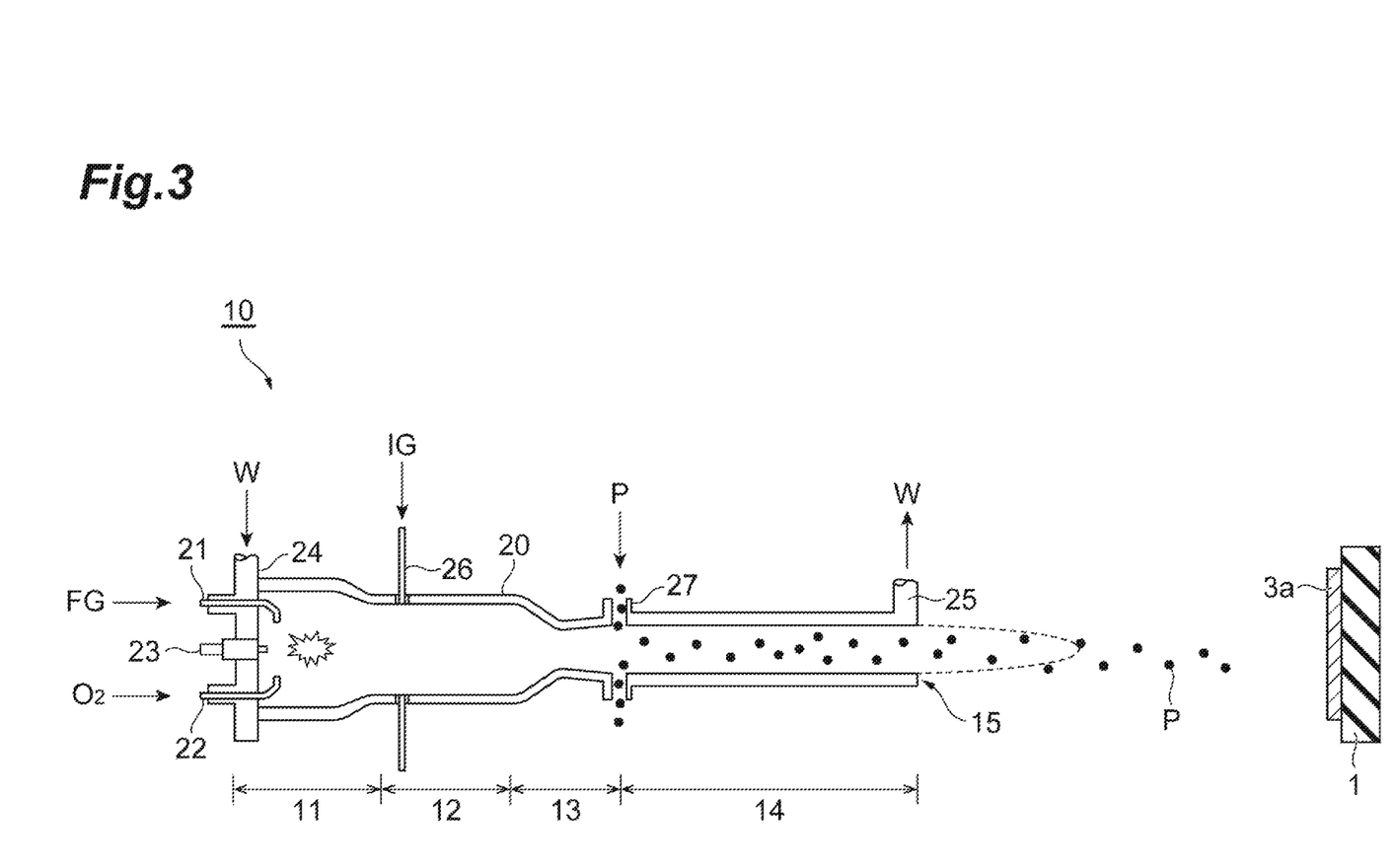
FIG. 3 is a schematic view illustrating an embodiment of a method for manufacturing the aluminum circuit board.

FIG. 3 is a schematic view illustrating an embodiment of a method for manufacturing the aluminum circuit board exemplified in FIG. 1 or FIG. 2. In the method illustrated in FIG. 3, metal powder P consisting of many metal particles is heated, and is accelerated to a predetermined velocity by a warm spraying device 10, and is sprayed to the surface of the ceramic base material 1. The metal particles P may be aluminum particles, aluminum alloy particles, or a combination thereof The aluminum alloy particles may be particles formed of aluminum, magnesium of less than or equal to 7.5 mass % on the basis of the mass of the aluminum alloy particles, and residual inevitable impurities.

The warm spraying device 10 includes a tubular body 20, a fuel inlet 21, an oxygen inlet 22, an ignition plug 23, a cooling water inlet 24, a cooling water outlet 25, an inert gas inlet 26, and a powder feed port 27. The tubular body 20 includes a combustion chamber 11, a mixing chamber 12, an outlet nozzle 13, and a barrel portion 14. An injection port 15 is provided at the end of the barrel portion 14. In the combustion chamber 11, fuel gas FG such as gasified liquid fuel that may be kerosene or the like or propane gas or liquefied petroleum gas is mixed with oxygen gas $O_2$, and the mixed gas is ignited by the ignition plug 23. As the mixed gas is combusted, the temperature and pressure of the combustion gas increases. In the mixing chamber 12, inert gas IG is fed and mixed into the combustion gas flowing out from the combustion chamber 11 in order to adjust the combustion gas temperature. In the outlet nozzle 13, thus generated high-temperature and high-pressure mixed gas expands through a divergent nozzle, and becomes a high-velocity jet, and thus, is ejected to the barrel portion 14. The barrel portion 14 is a straight cylindrical barrel connected to the outlet nozzle 13 in a continuous manner. The metal particles P, i.e., the metal powder, are fed from the powder feed port 27 provided between the outlet nozzle 13 and the barrel portion 14 to the inlet of the barrel portion 14. The whole body of the warm spraying device is cooled by cooling water.

By the warm spraying device 10 in FIG. 3, the metal particles P are sprayed towards the ceramic base material 1 from the injection port 15 at a high speed, along with the mixed gas of the combustion gas and the inert gas IG, and thus, the metal particles P are deposited on the ceramic base material 1, and the metal layer 3a is formed.

It is preferred that the temperature of at least a part of the metal powder sprayed to the ceramic base material 1 be higher than or equal to a softening temperature of the metal powder and lower than or equal to the melting point of the metal powder when reaching the surface of the ceramic base material 1. Here, the softening temperature is defined as a value of melting point×0.6 in the absolute temperature scale. It is preferred that the velocity of at least a part of the metal powder sprayed to the ceramic base material 1 be greater than or equal to 450 m/s and less than or equal to 1000 m/s when reaching the surface of the ceramic base material 1. For example, the ratio of metal powder of which the temperature at the time point of reaching the surface of the ceramic base material 1 is lower than or equal to the softening temperature of the metal powder may be less than or equal to 10 mass %, the ratio of metal powder of which the temperature at the time point of reaching the surface of the ceramic base material 1 is higher than the melting point of the metal powder may be less than or equal to 10 mass %, and the temperature of the rest of the metal powder at the time point of reaching the surface of the ceramic base material may be higher than or equal to the softening temperature of the metal powder and lower than or equal to the melting point of the metal powder.

The temperature and the velocity of the metal particles P (or the metal powder) at the time point of reaching the surface of the ceramic base material 1 can be adjusted by suitably changing the particle size distribution of the metal powder, the flow rate of the inert gas, the distance between the injection port 15 and the surface of the ceramic base material 1, and the like. In general, the distance between the injection port 15 and the surface of the ceramic base material 1 is set to be in a range of 100 mm to 400 mm.

In a case where a second metal layer is formed on the surface of the first metal layer as shown in FIG. 3, a method for forming the second metal layer is not limited to the method described above, and may be identical to or different from that of the first metal layer. For example, a second metal powder containing aluminum particles as its main component may be fed to the warm spraying method of which the condition is suitably set, to form the second metal layer.

Figure 4:
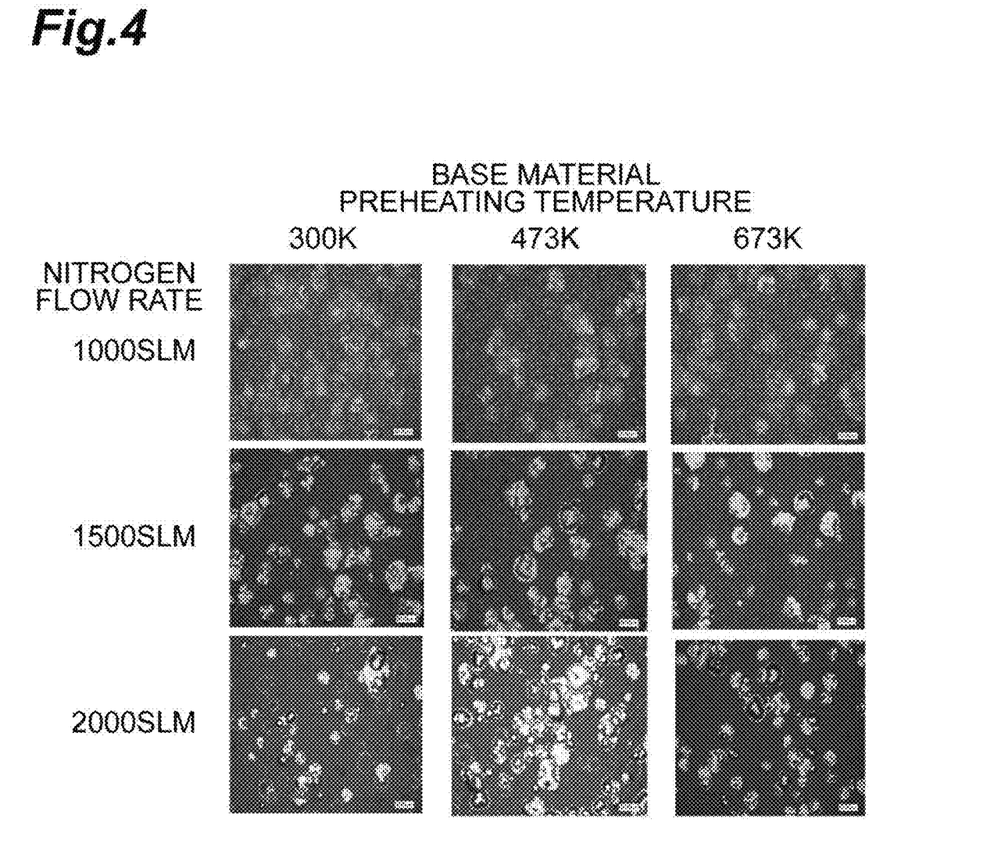
FIG. 4 is microscopic photographs of aluminum particles that were sprayed to an aluminum nitride base material, and are attached onto the surface of the base material.

FIG. 4 is microscopic photographs of aluminum particles that are attached onto a surface of an aluminum nitride base material. These samples were prepared by scanning a warm spraying device over the aluminum nitride base material at a high velocity while minimizing the feed rate of the aluminum particles, and thereby spraying a small amount of aluminum particles to the surface of the aluminum nitride base material. While changing the nitrogen flow rate of the warm spraying device in three steps of 1000 SLM, 1500 SLM, and 2000 SLM, the preheating temperature of the aluminum nitride base material for each nitrogen flow rate was changed in three steps of 300K (without preheating, RT), 473K, and 673K. As shown in FIG. 4, a large number of particles were scattered and became fine particles at a nitrogen flow rate of 1000 SLM, and it is considered that this is because the ratio of aluminum particles that have been melted at a time point of reaching the surface of the base material was high. Semi-molten particles of which the center is not melted and the surroundings are melted are commonly observed at a nitrogen flow rate of 1500 SLM. The ratio of molten particles decreased, and a number of trace of large particles that collided and dropped off is observed at a nitrogen flow rate of 2000 SLM. Here, SLM is an abbreviation of standard liter/min, and is a unit indicating a gas flow rate (liter) per 1 minute at 1 atm and 0° C.

Figure 5:
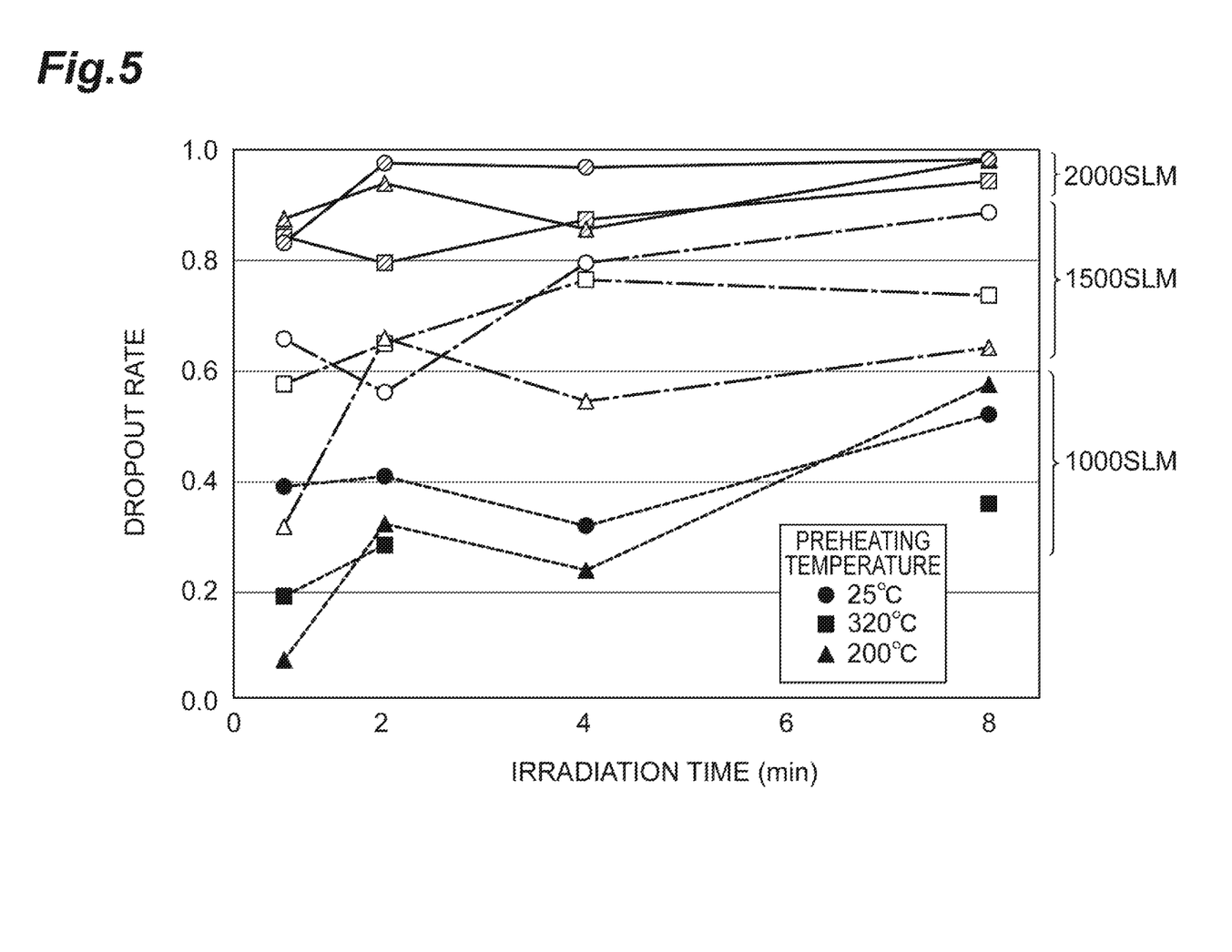
FIG. 5 is a graph showing the relationship between the ratio of removed area from a metal layer and the duration of ultrasonic wave irradiation.

Adhesion of the particles was evaluated by dipping the samples obtained by the aforementioned method into water and applying cavitation by an ultrasonic horn, thereafter the amount of the aluminum particles dropped out of the substrate was compared. FIG. 5 is a graph in which the ultrasonic irradiation time is plotted on the horizontal axis, whereas the ratio of dropped-out particles on a silicon nitride substrate at three levels of nitrogen flow rates and three levels of preheating temperatures are plotted on the vertical axis. As a general trend, more than 80% of the particles were dropped out by irradiation of 1 minute at a nitrogen flow rate of 2000 SLM. It was observed that the dropout rate decreased as the nitrogen flow rate decreased, that is, the adhesion of the particles was improved. The influence of the preheating of the base material is less remarkable, but in a case where the base material is not preheated, there is a tendency that the adhesion is slightly weak, and thus, it is considered that preheating to a temperature higher than 200° C. is suitable. Therefore, the preheating temperature of the ceramic base material to which the metal powder is sprayed, for example, may be from 200° C. to 600° C.

Figure 6:
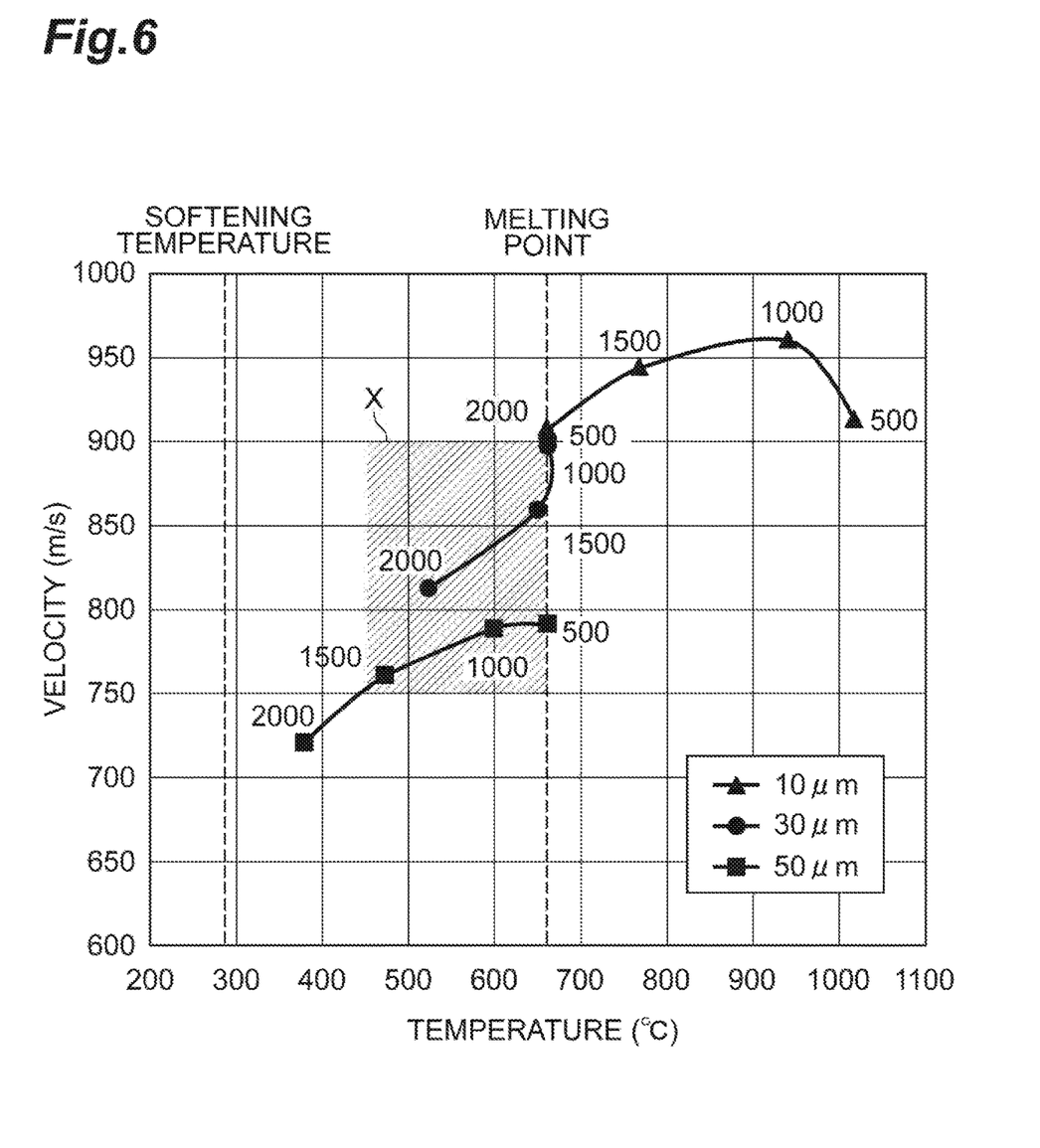
FIG. 6 is a graph showing the relationship between the velocity and the temperature of aluminum particles provided by a warm spray apparatus used to form of a metal layer.

FIG. 6 is a graph showing the relationship between the velocity and the temperature of aluminum particles that are generated by the warm spraying device 10 for fabrication of metal layers. The graph of FIG. 6 shows such relationship of velocity and temperature for particles with three different diameters, i.e., 10 μm, 30 μm, and 50 μm, which appear as three curves.

The relationship between the velocity and the temperature of the aluminum particles at the time point of reaching the surface of the ceramic base material is plotted for different flow rates of the inert gas IG (nitrogen gas) such as 500 SLM, 1000 SLM, 1500 SLM, and 2000 SLM in the warm spraying device 10 in FIG. 6. Here, the distance between the injection port 15 of the warm spraying device 10 and the base material surface is set to 200 mm, and the velocity and the temperature of the aluminum particles at the time point of reaching the surface of the ceramic base material was calculated by a numerical simulation. FIG. 6 also shows the melting point (660° C., 933K) and the softening temperature (287° C., 560K) of aluminum particles.

As shown in FIG. 6, for aluminum particles with a particle diameter of less than or equal to 10 μm, their temperature is higher than the melting point, and thus, the aluminum particles are completely melted. Therefore, it is desirable that the ratio of particles having a particle diameter of less than or equal to 10 μm is small from the viewpoint of suppressing disintegration, oxidation, and the like. In addition, as described above, the adhesion of particles having a particle diameter of 50 μm decreases at a nitrogen flow rate of 2000 SLM. Considering these points, a region indicated as X in FIG. 6, that corresponds to a range of temperature of the particles higher than or equal to 450° C. (723K) and lower than or equal to the melting point (660° C., 933K), and of the velocity of the particles greater than or equal to 750 m/s and less than or equal to 900 m/s, is particularly suitable for the metal layer deposition. Even for the aluminum alloy particles, essentially the same range of temperature and velocity should be suitable.

In addition, from FIG. 6, it is preferable that $D_{10}$ is greater than or equal to 10 μm, and $D_{90}$ is less than or equal to 50 μm for the particle diameter distribution of the metal powder used for the warm spraying device. It is more preferable that $D_{10}$ is greater than or equal to 20 μm, and $D_{90}$ is less than or equal to 45 μm.

Electrical resistivity of the metal layer (an aluminum film) formed by the warm spraying method at a nitrogen flow rate of 1000 SLM and 1500 SLM was measured, and values of 3.3 to 3.7×10$^{-8}$ Ωm were obtained respectively. 2.65×10$^{-8}$ Ωm is known as a reported value of electrical resistance of dense solid of pure aluminum. In addition, there is also a report that a resistivity of an aluminum film formed by a cold spraying method is greater than or equal to 10×10$^{-8}$ μm (see Non Patent Literature 1). The electrical resistance value of the aluminum film framed by the warm spraying method is obviously lower than that of the aluminum film formed by the cold spraying method. A low electric resistance value indicates that a denser aluminum film is formed. Thus we can state that the electrical resistivity of a metal layer formed by the method according to the embodiment as described above can be less than or equal to $5 \times 10^{-8}$ Ωm.

In the embodiment described above, a case where a board on which the metal layer (the circuit layer) is provided is monolithic ceramic has been exemplified, but the present invention is not limited thereto. The board may be a metal composite board containing a combination of ceramic and metals such as copper, aluminum, silver, and the like, or a resin composite board containing a combination of ceramic and a resin such as an engineering plastic resin. In such case, a metal layer is formed on the surface of the ceramic base material that is usually provided as the outermost layer. The engineering plastic resin to be combined with the ceramic base material, for example, may be polyacetal (POM), polyamide (PA), polycarbonate (PC), modified polyphenylene ether (m-PPE), or polybutylene terephthalate (PBT).

The aluminum circuit board as described above is useful as a member configuring various electronic devices.

EXAMPLES

Hereinafter, the present invention will be described in more detail by using examples. However, the present invention is not limited to the examples.

In all examples and all comparative examples, an aluminum nitride base material (Size: 60 mm×50 mm×0.635 mmt, Three-Point Bending Strength: 500 MPa, Heat Conductivity: 150 W/mK, and Purity: greater than or equal to 95%) and a silicon nitride base material (Size: 60 mm×50 mm×0.635 mint, Three-Point Bending Strength: 700 MPa, Heat Conductivity: 70 W/mK, and Purity: greater than or equal to 92%) were used as the ceramic base material.

Film Formation Test 1

The following film formation test was performed by using a warm spraying device having the same configuration as that illustrated in FIG. 3.

The aluminum nitride base material was covered with an iron mask with an opening. Aluminum powder (manufactured by Fukuda Metal Foil & Powder Co., Ltd., a water atomized powder, Purity: 99.7%, Particle Diameter: less than or equal to 45 μm, and Melting Point: 933K) was subjected to film formation on the surface of the aluminum nitride base material in the opening of the mask by a warm spraying method, and thus, a metal layer having a predetermined pattern (56 mm×46 mm×300 μnit) was formed. Nitrogen was used as inert gas for the warm spraying method. Similarly, a metal layer was also formed on the opposite surface of the aluminum nitride base material. The warm spraying condition was set to realize particle temperatures and particle velocities as shown in Table 1. Here, the particle temperature and the particle velocity are these values of most of the aluminum powder at a time point of reaching the base material (the same applies to Film Formation Test 2).

Further, a film formation test was performed similarly by using the silicon nitride base material instead of the aluminum nitride base material.

Film Formation Test 2

Film formation of a first metal layer using an aluminum-magnesium alloy powder was performed using the warm spraying condition shown in Table 1 in the same manner with Film Formation Test 1. The aluminum-magnesium alloy powder (manufactured by Kojundo Chemical Lab. Co., Ltd., a gas atomized powder, Magnesium Content: 3.0 mass %, Amount of Impurities Other than Aluminum and Magnesium: less than or equal to 0.1 mass %, Particle Diameter: less than or equal to 45 μm, and Melting Point: 913K) was used instead of the aluminum powder.

The results of these film formation tests are shown in Table 1. In the column "Film formation availability" of the table, "Available" indicates that a (first) metal layer was normally formed, and "Unavailable" indicates that metal particles were not attached to the base material, and thus, a metal layer could not be formed.

Aluminum powder (manufactured by Fukuda Metal Foil & Powder Co., Ltd., a water atomized powder, Purity: 99.7%, and Particle Diameter: less than or equal to 45 μm) was subjected to film formation on the surface of the test examples (15, 16, 20, and 23) on which a first metal layer was successfully formed by the warm spraying method, and thus, a second metal layer (56 mm×46 mm×200 μmt) was further formed on the first metal layer. In the film formation for the second layer by the warm spraying method, nitrogen was used as inert gas, and the condition corresponded to Particle Temperature: 500° C. and Particle Velocity: 800 m/s.

TABLE 1

| | | (First) Metal layer | | | | | Second metal layer | |
|---|---|---|---|---|---|---|---|---|
| Test No. | Base material | Particle temp. (K) | Particle velocity (m/s) | Particle type | Thickness (μm) | Film formation availability | Particle Type | Thickness (μm) |
| 1 | AlN | 530 | 900 | Al | 300 | Unavailable | — | — |
| 2 | AlN | 560 | 400 | Al | 300 | Unavailable | — | — |
| 3 | AlN | 560 | 500 | Al | 300 | Available | — | — |
| 4 | AlN | 930 | 900 | Al | 300 | Available | — | — |
| 5 | AlN | 930 | 1100 | Al | 300 | Unavailable | — | — |
| 6 | AlN | 960 | 500 | Al | 300 | Unavailable | — | — |
| 7 | Si$_3$N$_4$ | 530 | 500 | Al | 300 | Unavailable | — | — |
| 8 | Si$_3$N$_4$ | 560 | 900 | Al | 300 | Available | — | — |
| 9 | Si$_3$N$_4$ | 560 | 1100 | Al | 300 | Unavailable | — | — |
| 10 | Si$_3$N$_4$ | 930 | 400 | Al | 300 | Unavailable | — | — |
| 11 | Si$_3$N$_4$ | 930 | 500 | Al | 300 | Available | — | — |
| 12 | Si$_3$N$_4$ | 960 | 900 | Al | 300 | Unavailable | — | — |
| 13 | AlN | 530 | 900 | Al—Mg | 150 | Unavailable | — | — |
| 14 | AlN | 560 | 400 | Al—Mg | 150 | Unavailable | — | — |

TABLE 1-continued

| | | (First) Metal layer | | | | Second metal layer | |
|---|---|---|---|---|---|---|---|
| | | Particle | Particle | | Film | | |
| Test No. | Base material | temp. (K) | velocity (m/s) | Particle type | Thickness (μm) | formation availability | Particle Type | Thickness (μm) |
| 15 | AlN | 560 | 900 | Al—Mg | 150 | Available | Al | 150 |
| 16 | AlN | 745 | 500 | Al—Mg | 150 | Available | Al | 150 |
| 17 | AlN | 745 | 1100 | Al—Mg | 150 | Unavailable | — | — |
| 18 | AlN | 960 | 500 | Al—Mg | 150 | Unavailable | — | — |
| 19 | $Si_3N_4$ | 530 | 500 | Al—Mg | 150 | Unavailable | — | — |
| 20 | $Si_3N_4$ | 560 | 500 | Al—Mg | 150 | Available | Al | 150 |
| 21 | $Si_3N_4$ | 560 | 1100 | Al—Mg | 150 | Unavailable | — | — |
| 22 | $Si_3N_4$ | 745 | 400 | Al—Mg | 150 | Unavailable | — | — |
| 23 | $Si_3N_4$ | 745 | 900 | Al—Mg | 150 | Available | Al | 150 |
| 24 | $Si_3N_4$ | 960 | 900 | Al—Mg | 150 | Unavailable | — | — |

Heat Cycle Test

For the film formation conditions (3, 4, 8, 11, 15, 16, 20, and 23) in which a test body was obtained, these test bodies were subjected to a heat cycle test. In the heat cycle test, "at 180° C. for 30 minutes, and then, at −45° C. for 30 minutes" was set as one cycle, and a test of 1000 cycles was performed. After the heat cycle test, abnormality such as peeling did not occur in the metal layers.

INDUSTRIAL APPLICABILITY

The present invention is useful for manufacturing an aluminum circuit board that includes a circuit containing aluminum. Processing conditions such as the amount of metal powder and its heating temperature can be suitably managed to manufacture a circuit board including a resin composite board of ceramic and an engineering plastic resin as well as a metal composite board of ceramic and a metal. The method of the present invention is excellent in mass productivity and general versatility.

REFERENCE SIGNS LIST

1: ceramic base material, 3a, 3b: (first) metal layer, 5a, 5b: second metal layer (circuit layer), 11: combustion chamber, 12: mixing chamber, 13: outlet nozzle, 14: barrel portion, 15: injection port, 20: tubular body, 21: fuel inlet, 22: oxygen inlet, 23: ignition plug, 24: cooling water inlet, 25: cooling water outlet, 26: inert gas inlet, 27: powder feed port, 50, 100: aluminum circuit board, FG: fuel gas, IG: inert gas, P: metal particles, W: cooling water.

The invention claimed is:

1. A method for manufacturing an aluminum circuit board, comprising:
    a step of spraying heated metal powder containing aluminum particles and/or aluminum alloy particles to a ceramic base material, and thereby forming a metal layer on a surface of the ceramic base material,
    wherein the temperature of at least a part of the metal powder is higher than or equal to 450° C. of the metal powder and lower than or equal to the melting point of the metal powder at a time point of reaching the surface of the ceramic base material, and
    the velocity of at least a part of the metal powder is greater than or equal to 450 m/s and less than or equal to 1000 m/s at the time point of reaching the surface of the ceramic base material.

2. The manufacturing method according to claim 1, wherein the velocity of at least a part of the metal powder is greater than or equal to 750 m/s and less than or equal to 900 m/s at the time point of reaching the surface of the ceramic base material.

3. The manufacturing method according to claim 1, wherein in the particle diameter distribution of the metal powder, the particle diameter $D_{10}$, which is the diameter at which 10% of the sample's mass is comprised of particles with a diameter less than this value, is greater than or equal to 10 μm, and the particle diameter $D_{90}$, which is the diameter at which 90% of the sample's mass is comprised of particles with a diameter less than this value, is less than or equal to 50 μm.

4. The manufacturing method according to claim 3, wherein in the particle diameter distribution of the metal powder, the particle diameter $D_{10}$ is greater than or equal to 20 μm, and the particle diameter $D_{90}$ is less than or equal to 45 μm.

5. The manufacturing method according to claim 1, wherein the aluminum alloy particles are particles consisting of: aluminum; magnesium of less than or equal to 7.5 mass % on the basis of the mass of the aluminum alloy particles; and residual inevitable impurities.

6. The manufacturing method according to claim 1, wherein the metal powder contains aluminum alloy particles, and
the manufacturing method further comprises:
    a step of spraying heated second metal powder containing aluminum particles to a surface of the first metal layer that is the metal layer formed on the surface of the ceramic base material, and thereby forming a second metal layer on the surface of the first metal layer.

7. The method for manufacturing the aluminum circuit board according to claim 6,
wherein a thickness of the first metal layer is less than or equal to 150 μm.

8. The manufacturing method according to claim 1, wherein said temperature is higher than or equal to 450° C. and lower than or equal to 660° C., and said velocity is greater than or equal to 750 m/s and less than or equal to 900 m/s.

9. The manufacturing method according to claim 1, wherein the metal powder is sprayed with a warm spraying device comprising a tubular body including an outlet nozzle and a barrel portion, the outlet nozzle includes a divergent nozzle, the barrel portion is a straight cylindrical barrel connected to the outlet nozzle in a continuous manner, and the metal powder is fed from a powder feed port provided between the outlet nozzle and the barrel portion to the inlet of the barrel portion.

10. A method for manufacturing an aluminum circuit board, comprising:
a step of spraying heated metal powder containing aluminum particles and/or aluminum alloy particles to a ceramic base material, and thereby forming a metal layer on a surface of the ceramic base material,
wherein in a case where the metal powder is sprayed to the ceramic base material by being heated and accelerated by the warm spraying method, in the mass-based cumulative particle diameter distribution of the metal powder, the particle diameter $D_{10}$ is greater than or equal to 10 μm, and the particle diameter $D_{90}$ is less than or equal to 50 μm,
in the metal powder that is sprayed to the ceramic base material, the ratio of the metal powder of which temperature at a time point of reaching the surface of the ceramic base material is lower than 450° C. of the metal powder is less than or equal to 10 mass %, and the ratio of the metal powder of which temperature at the time point of reaching the surface of the ceramic base material is higher than the melting point of the metal powder is less than or equal to 10 mass %, and the temperature of the rest of the metal powder at the time point of reaching the surface of the ceramic base material is higher than or equal to 450° C. of the metal powder and lower than or equal to the melting point of the metal powder, and the velocity of at least a part of the metal powder is greater than or equal to 450 m/s and less than or equal to 1000 m/s at the time point of reaching the surface of the ceramic base material.

11. The manufacturing method according to claim 10,
wherein the metal powder is sprayed with a warm spraying device comprising a tubular body including an outlet nozzle and a barrel portion, the outlet nozzle includes a divergent nozzle, the barrel portion is a straight cylindrical barrel connected to the outlet nozzle in a continuous manner, and the metal powder is fed from a powder feed port provided between the outlet nozzle and the barrel portion to the inlet of the barrel portion.

12. An aluminum circuit board, comprising:
a ceramic base material; and
a metal layer formed by performing film formation of metal powder containing aluminum particles and/or an aluminum alloy particles on a surface of the ceramic base material, wherein the temperature of at least a part of the metal powder is higher than or equal to 450° C. and lower than or equal to the melting point of the metal powder at a time point of reaching the surface of the ceramic base material by the warm spraying method,
wherein an electric resistivity of the metal layer is less than or equal to $4\times10^{-8}$ Ωm.

13. An electronic device, comprising the aluminum circuit board according to claim 12.

* * * * *